US 6,670,868 B2

(12) United States Patent
Kawase et al.

(10) Patent No.: US 6,670,868 B2
(45) Date of Patent: Dec. 30, 2003

(54) SURFACE ACOUSTIC WAVE FILTER DEVICE

(75) Inventors: Minoru Kawase, Yokohama (JP); Masayoshi Koshino, Tokyo (JP); Yasuo Ebata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/347,449

(22) Filed: Jan. 21, 2003

(65) Prior Publication Data

US 2003/0107457 A1 Jun. 12, 2003

Related U.S. Application Data

(63) Continuation of application No. PCT/JP01/06307, filed on Jul. 19, 2001.

(30) Foreign Application Priority Data

Jul. 21, 2000 (JP) ........................................ 2000-220984

(51) Int. Cl.[7] ............................................... H03H 9/64
(52) U.S. Cl. ..................... 333/193; 333/195; 333/133; 310/313 D
(58) Field of Search ................................. 333/193–196, 333/133; 310/313 R, 313 B, 313 C, 313 D

(56) References Cited

U.S. PATENT DOCUMENTS 6,388,545 B1 * 5/2002 Kawachi et al. ............ 333/193
6,417,574 B1 * 7/2002 Misawa et al. ............. 257/778

FOREIGN PATENT DOCUMENTS

| JP | 4-54011 | * 2/1992 | ................. 333/193 |
| JP | 10-224175 | 8/1998 | |
| JP | 11-298283 | 10/1999 | |
| JP | 2000-91871 | 3/2000 | |

* cited by examiner

Primary Examiner—Barbara Summons
(74) Attorney, Agent, or Firm—Oblon, Spivak, McClelland, Maier & Neustadt, P.C.

(57) ABSTRACT

An elastic surface wave element including first and a second two-port surface acoustic wave filters and a one-port elastic surface acoustic wave resonator filter with a single interdigital transducer is connected via bumps to electrodes formed on a housing by face down bonding techniques. The housing has an opening section in a ground terminal electrode in a part facing the one-port elastic surface acoustic wave resonator filter.

9 Claims, 14 Drawing Sheets

SURFACE ACOUSTIC WAVE FILTER DEVICE

CROSS-REFERENCE TO RELATED APPLICATIONS

This is a Continuation Application of PCT Application No. PCT/JP01/06307, filed Jul. 19, 2001, which was not published under PCT Article 21(2) in English.

This application is based upon and claims the benefit of priority from the prior Japanese Patent Application No. 2000-220984, filed Jul. 21, 2000, the entire contents of which are incorporated herein by reference.

BACKGROUND OF THE INVENTION

1. Field of the Invention

This invention relates to a surface acoustic wave filter device where an elastic surface element and a housing are assembled particularly by face down bonding techniques.

2. Description of the Related Art

As is generally known, surface acoustic wave filter devices are compact and light and have a high performance and high reliability in terms of functions, so that they have been widely used in various fields.

Two-way transmission filters for mobile communication are required to present high attenuation characteristics to the frequency blocking regions in their frequency characteristics. One two-way transmission filter is so constructed that a plurality of inter-digital transducers (hereinafter, referred to as IDTs) are arranged in the direction in which elastic surface waves propagate and mode-coupling two-port surface acoustic wave filters using the multiple resonance mode are connected in a multistage manner (a surface acoustic wave filter device).

To improve the frequency characteristic of a surface acoustic wave filter device, a method of connecting a one-port resonator in series with mode-coupling two-port surface acoustic wave filters can be considered.

In this case, the one-port resonator is used as a notch filter. When the attenuation pole of the one-port resonator is set near the high-pass region of the frequency pass band of the mode-coupling two-port surface acoustic wave filters, the entire frequency characteristic presents a sharp cut-off characteristic in the high-frequency region.

Here, the inventors of the present invention directed their attention to the fact that the addition of a one-port resonator causes a new problem. The inventors concentrated their attention on the fact that the problem particularly arises in a surface acoustic wave filter device where component parts are assembled by face down bonding techniques. In a surface acoustic wave filter device using face down bonding techniques, the notch characteristic of the one-port resonator cannot be obtained in the desired frequency region as designed, with the result that the entire frequency pass band characteristic of a surface acoustic wave filter device superior in quality cannot be obtained.

SUMMARY OF THE INVENTION

It is accordingly an object of the present invention to provide a surface acoustic wave filter device which enables the notch characteristic of a one-port resonator to be obtained reliably near the high-pass region of the frequency pass band of a mode-coupling two-port surface acoustic wave filter, even when component parts are assembled by face down bonding techniques.

Another object of the present invention is to provide a surface acoustic wave filter device which enables unnecessary stray capacitance components in a one-port resonator to be reduced sufficiently and realizes a frequency pass band characteristic excellent in flatness.

To accomplish the foregoing objects, an embodiment of the present invention is configured as follows. In a surface acoustic wave filter device where the electrodes of an elastic surface wave element are connected via bumps to the electrodes of a housing by face down bonding techniques, the elastic surface wave element has a first two-port surface acoustic wave filter, a one-port elastic surface wave resonator filter to which the output of the first surface acoustic wave filter is supplied, a second two-port surface acoustic wave filter to which the output of the one-port elastic surface wave resonator filter is supplied, elastic-surface-wave-element side signal input and output electrodes, and an elastic-surface-wave-element side ground electrode each formed on one face of a piezoelectric substrate. In addition, the housing has signal input and output electrodes and a ground terminal electrode corresponding to the elastic-surface-wave-element side signal input and output electrodes and the elastic-surface-wave-element side ground electrode, the ground electrode having an opening section facing the one-port elastic surface wave resonator filter.

DETAILED DESCRIPTION OF THE INVENTION

Hereinafter, referring to the accompanying drawings, embodiments of the present invention will be explained.

Figure 1A:
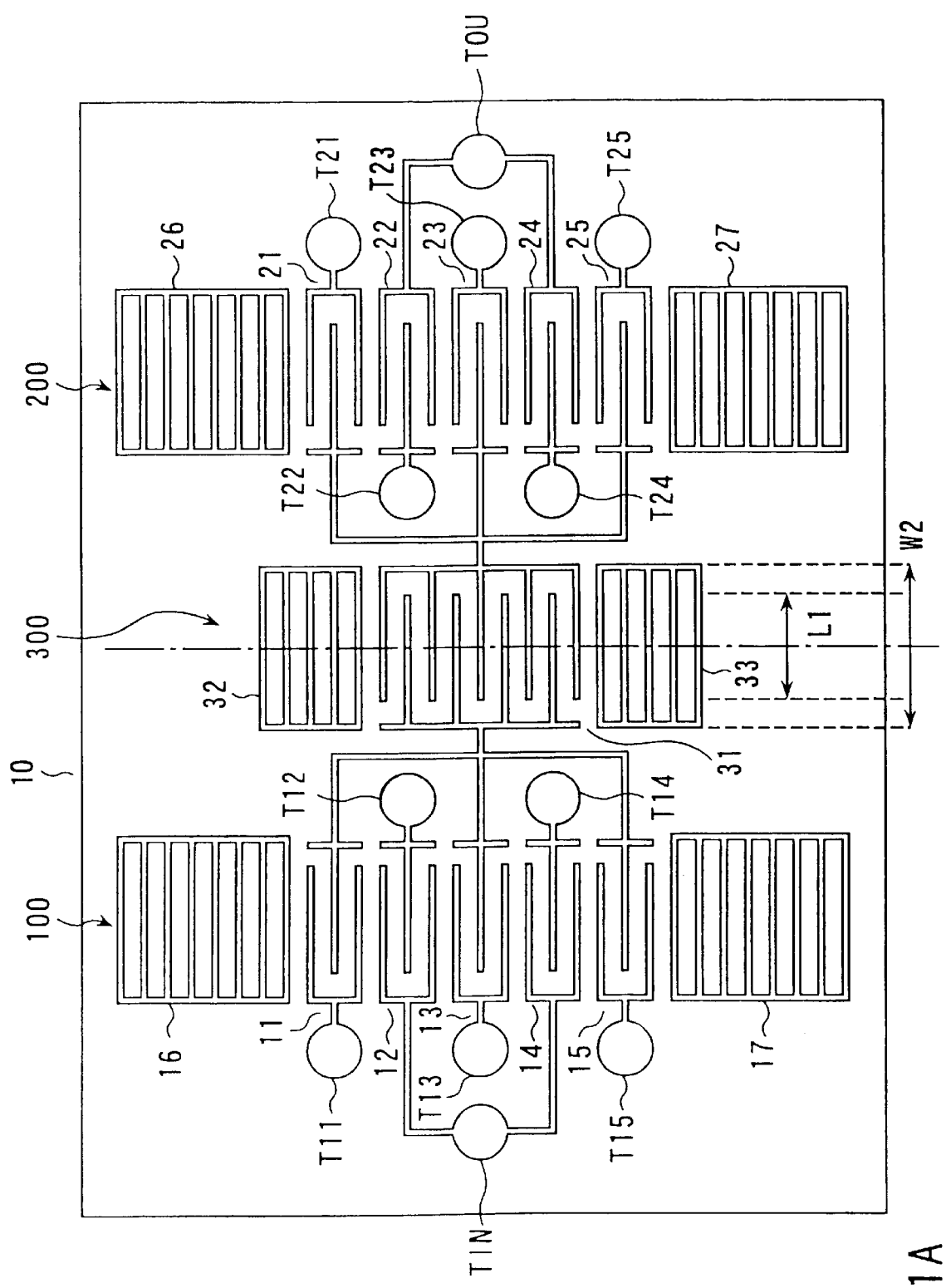
FIG. 1A shows an example of an elastic surface wave element with mode-coupling two-port surface acoustic wave filters to help explain an embodiment of a surface acoustic wave filter device according to the present invention.

In FIG. 1A, numeral 10 indicates a piezoelectric substrate. FIG. 1A is a plan view of the piezoelectric substrate 10 looking down on the side where an inter-digital transducer is formed. At the right and left sides of the piezoelectric substrate 10, mode-coupling two-port surface acoustic wave filters 100, 200 are formed with a spacing between them. The mode-coupling two-port surface acoustic wave filters 100, 200 are made of a metal thin film, such as aluminium (Al), by manufacturing techniques, such as etching or evaporation.

The mode-coupling two-port surface acoustic wave filter 100 is composed of five IDTs (Inter-Digital Transducers) 11, 12, 13, 14, 15 provided side by side and reflectors 16, 17 provided on both sides of these IDTs 11 to 15. As is generally known, an IDT is composed of a pair of comb-tooth-like electrodes crossing each other in such a manner that they are staggered.

The one-end-side comb-tooth-like electrodes of the IDTs 11, 13, 15 are connected to ground terminals T11, T13, T15, respectively. The other-end-side comb-tooth-like electrodes of the IDTs 11, 13, 15 are connected together and further connected to one electrode of an elastic surface wave resonator filter 300 explained later. The one-end-side comb-tooth-like electrodes of the IDTs 12, 14 are connected in common to an input terminal TIN and the other-end-side comb-tooth-like electrodes are connected to ground terminals T12, T14, respectively.

Next, the mode-coupling two-port surface acoustic wave filter 200 will be explained. This filter is composed of five IDTs 21, 22, 23, 24, 25 provided side by side and reflectors 26, 27 provided on both sides of the IDTs 21 to 25. The one-end-side comb-tooth-like electrodes of the IDTs 21, 23, 25 are connected to ground terminals T21, T23, T25, respectively. The other-end-side comb-tooth-like electrodes of the IDTs 21, 23, 25 are connected together and further connected to the other electrode of the elastic surface wave resonator filter 300 explained later. The one-end-side comb-tooth-like electrodes of the IDTs 22, 24 are connected in common to an output terminal TOU and the other-end-side comb-tooth-like electrodes are connected to ground terminals T22, T24, respectively.

Next, the one-port elastic surface wave resonator filter 300 will be explained. This filter is composed of an IDT 31 and reflector 32, 33 provided on both sides of the IDT 31.

In the present invention, "port" means a pair of input and output terminals. Here, input and output terminals are considered in terms of an equivalent circuit and the number of input and output terminals is not necessarily equal to the number of terminals in the actual configuration. For example, the terminal TIN of the filter 100 and the wire to which three strip lines are joined and which is connected to the filter 300 make a pair and the terminals T11, T13, T15 and the terminals T12, T14 make a pair, which constructs a 2-port filter.

In the mode-coupling two-port surface acoustic wave filters 100, 200, five IDTs are arranged along the elastic surface wave propagating path of the piezoelectric substrate as shown in the figure. As is generally known, the pass band is obtained by coupling first-degree, third-degree, and fifth-degree longitudinal resonance modes.

In the elastic surface wave element where the mode-coupling two-port surface acoustic wave filters have been formed as described above, the elastic surface wave resonator filter 300 has the following function.

The mode-coupling two-port surface acoustic wave filters 100, 200 each function as a band-pass filter, but their frequency characteristics present insufficient attenuation characteristics on the high-pass region of the pass band. To overcome this drawback, a one-port elastic surface wave resonator filter 300 functioning as a notch filter is formed between the two filters 100, 200 and used together with the two filters 100, 200. The attenuation pole of the resonator filter 300 is set near the high-pass region of the frequency pass band of the mode-coupling two-port surface acoustic wave filter. This enables the high-frequency region of the entire frequency characteristic to present a sharp cut-off characteristic. This invention can achieve such performance sufficiently.

Figure 1B:
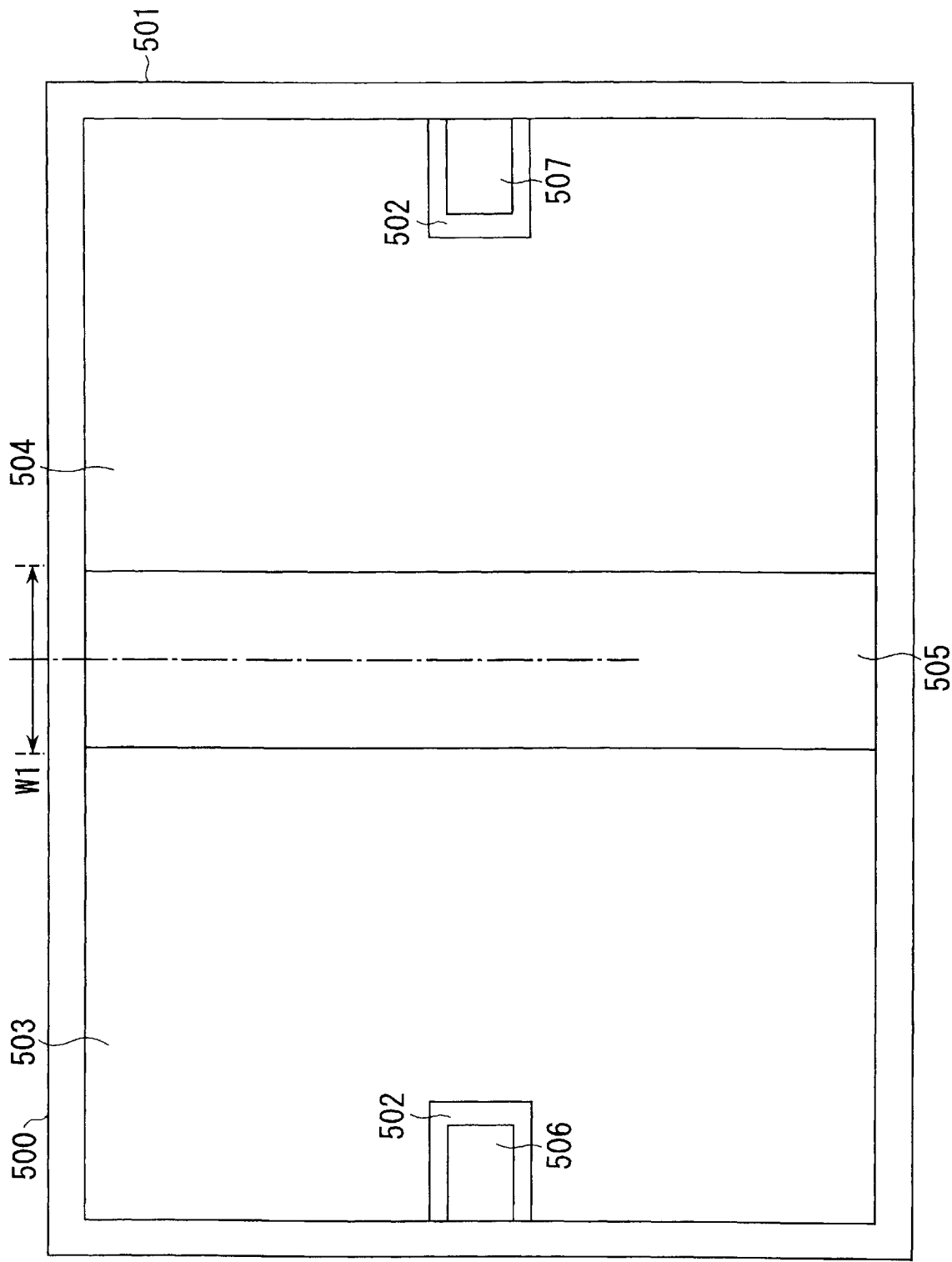
FIG. 1B shows an example of a housing to which an elastic surface wave element is attached by face down bonding techniques.
Figure 2A:
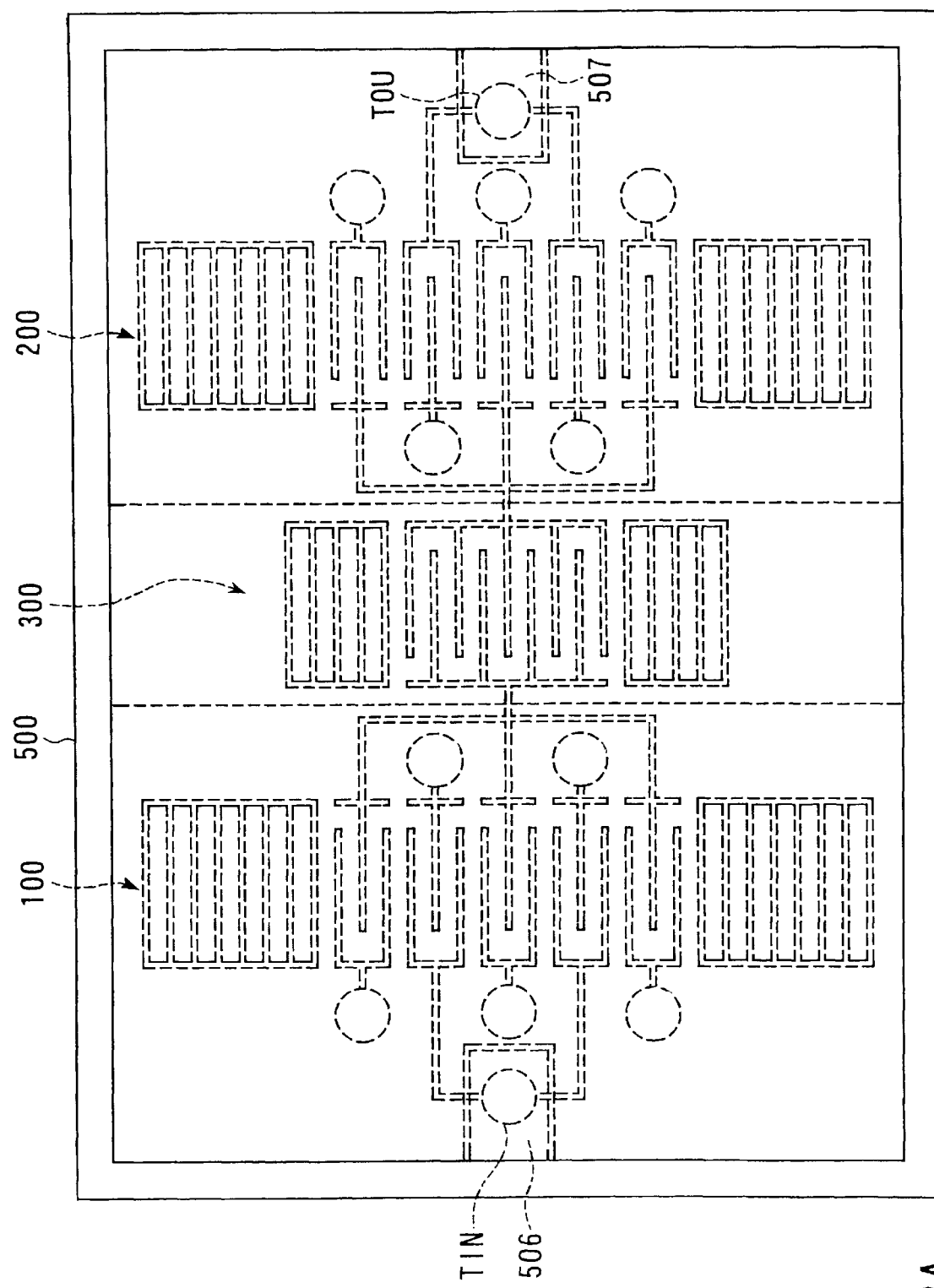
FIG. 2A is a plan view showing a state where the elastic surface wave element of FIG. 1A and the housing of FIG. 1B are laid one on top of the other.
Figure 2B:
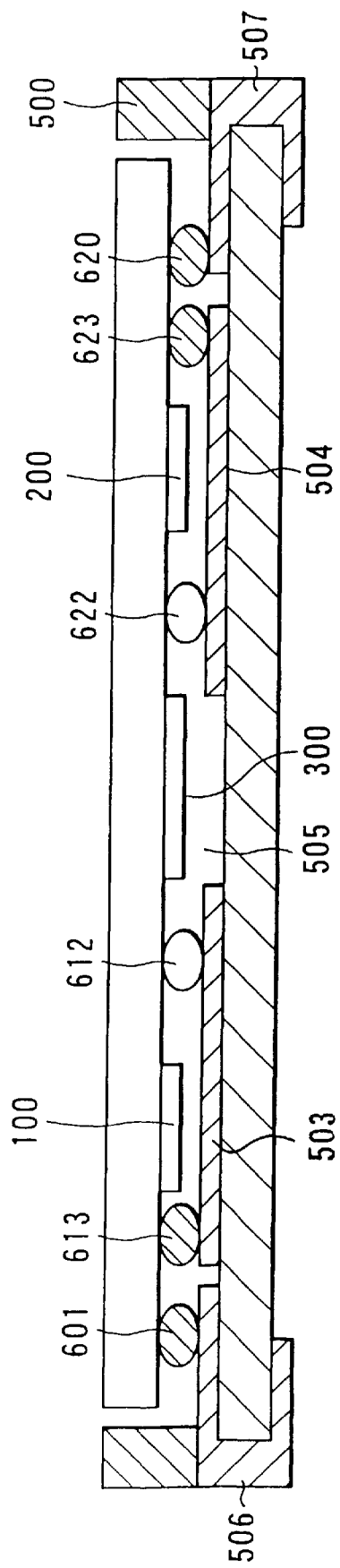
FIG. 2B is a sectional view showing a state where the elastic surface wave element of FIG. 1A and the housing of FIG. 1B are laid one on top of the other.

The reason for this is clarified in an explanation of FIG. 1B and FIGS. 2A and 2B.

In FIG. 1B, numeral 500 indicates a housing formed from, for example, an alumina ceramic substrate. On its periphery, a frame 501 is provided. That is, the housing 500 is formed into almost a flat plate made of insulating material. FIG. 1B is a plan view of the housing 500 taken from above.

On the opposite face of the housing 500 to the elastic surface wave element, ground terminal electrodes 503, 504, and an input terminal electrode 506 and an output terminal electrode 507 corresponding to the input terminal TIN and output terminal TOU, respectively, are formed. Between the ground terminal electrodes 503, 504, a gap (or an opening) 505 is formed. The gap 505 is in a position where it faces the elastic surface wave resonator filter 300. Therefore, the ground terminal electrodes can be considered to have their portions facing the elastic surface wave resonator filter 300 removed. Alternately, the ground terminal electrodes can be considered to have been divided into the mode-coupling two-port surface acoustic wave filter 100 side and the mode-coupling two-port surface acoustic wave filter 200 side.

In this embodiment, the width W1 of the gap 505 is greater than the width W2 of the elastic surface wave resonator filter 300 (or the opening L1 of IDT) (W1<W2).

The input terminal electrode 506 and output terminal electrode 507 corresponding to the input terminal TIN and output terminal TOU, respectively, are formed.

FIG. 2A is a view, taken from above, of the elastic surface wave element of FIG. 1A mounted on the housing 500 by face down bonding techniques. FIG. 2B is a sectional view of FIG. 2A.

The ground terminals T11, T13, T15 are connected to the ground terminal electrode 503 via bumps and the ground terminals T21, T23, T25 are connected to the ground terminal electrode 504 via bumps. The input terminal TIN is connected to the input terminal electrode 506 via a bump, and the output terminal TOU is connected to the output electrode 507 via a bump. In FIG. 2B, a bump 601 between the input terminal TIN and the input terminal electrode 506 and a bump 620 between the output terminal TOU and the output terminal electrode 507 appear. Moreover, bumps 613, 612 between the terminals T13 and T12 and the electrode 503 appear. In addition, bumps 623, 622 between the terminals T23 and T22 and the electrode 504 appear.

Although not shown, a cap is provided on the top of the housing 500 and the filter section is sealed.

In the surface acoustic wave filter device, when an input signal is supplied to the input terminal electrode 506, resonance occurs in the mode-coupling two-port surface acoustic wave filter 100. The output signal of the surface acoustic wave filter 100 is input to the elastic surface wave resonator filter 300. The output signal of the resonator filter 300 is input to the mode-coupling two-port surface acoustic wave filter 200. The output of the mode-coupling two-port surface acoustic wave filter 200 is taken out from the output terminal electrode 507.

Between the ground terminal electrodes 503, 504, a gap (or an opening) 505 is formed. The gap 505 is in a position where it faces the one-port elastic surface wave resonator filter 300. This enables a stray capacitance added to the elastic surface wave resonator filter 300 to be reduced sufficiently. As a result, the frequency characteristic of the elastic surface wave resonator filter 300 (or the characteristic of the notch filter) is achieved sufficiently as designed. The attenuation pole of the elastic surface wave resonator filter 300 is set reliably near the high-pass region of the frequency pass band of the mode-coupling two-port surface acoustic wave filter. Consequently, the frequency characteristic of the entire device is flat, with a sharp cut-off characteristic in the high-frequency region.

In the explanation, to make it easy to understand the configuration, the elastic surface wave element has been simplified. Actually, however, 100 IDTs may be provided. The opening L1 of an IDT (see FIG. 1A) is in the range of 80 to 100 microns. The width W1 of the gap 505 is selected from the range of 10 to 200 microns.

Next, the result of measuring the frequency characteristics and other characteristics of the surface acoustic wave filter device according to the present invention will be explained.

Figure 3:
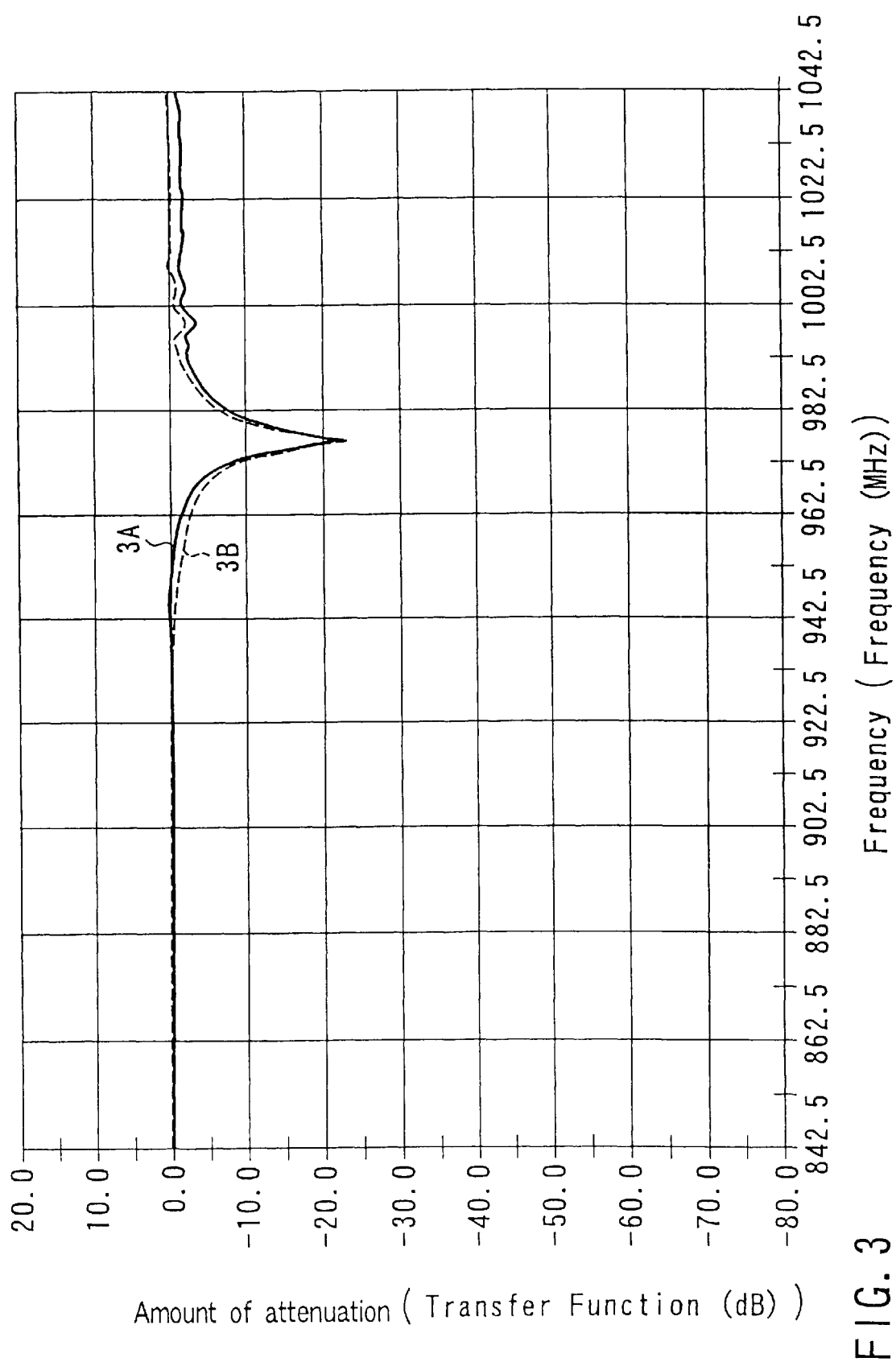
FIG. 3 is a diagram to help explain a characteristic of a one-port elastic surface wave resonator filter.

FIG. 3 shows frequency characteristics of the elastic surface wave resonator filter 300. The ordinate indicates the amount of attenuation and the abscissa indicates the frequency. The characteristic curve 3A shows a characteristic when an opening section is provided in the ground electrode and the characteristic curve 3B shows a characteristic when no opening section is provided. It can be seen that the characteristic shown by the characteristic curve 3A changes sharply near 962.5 MHz.

Figure 4:
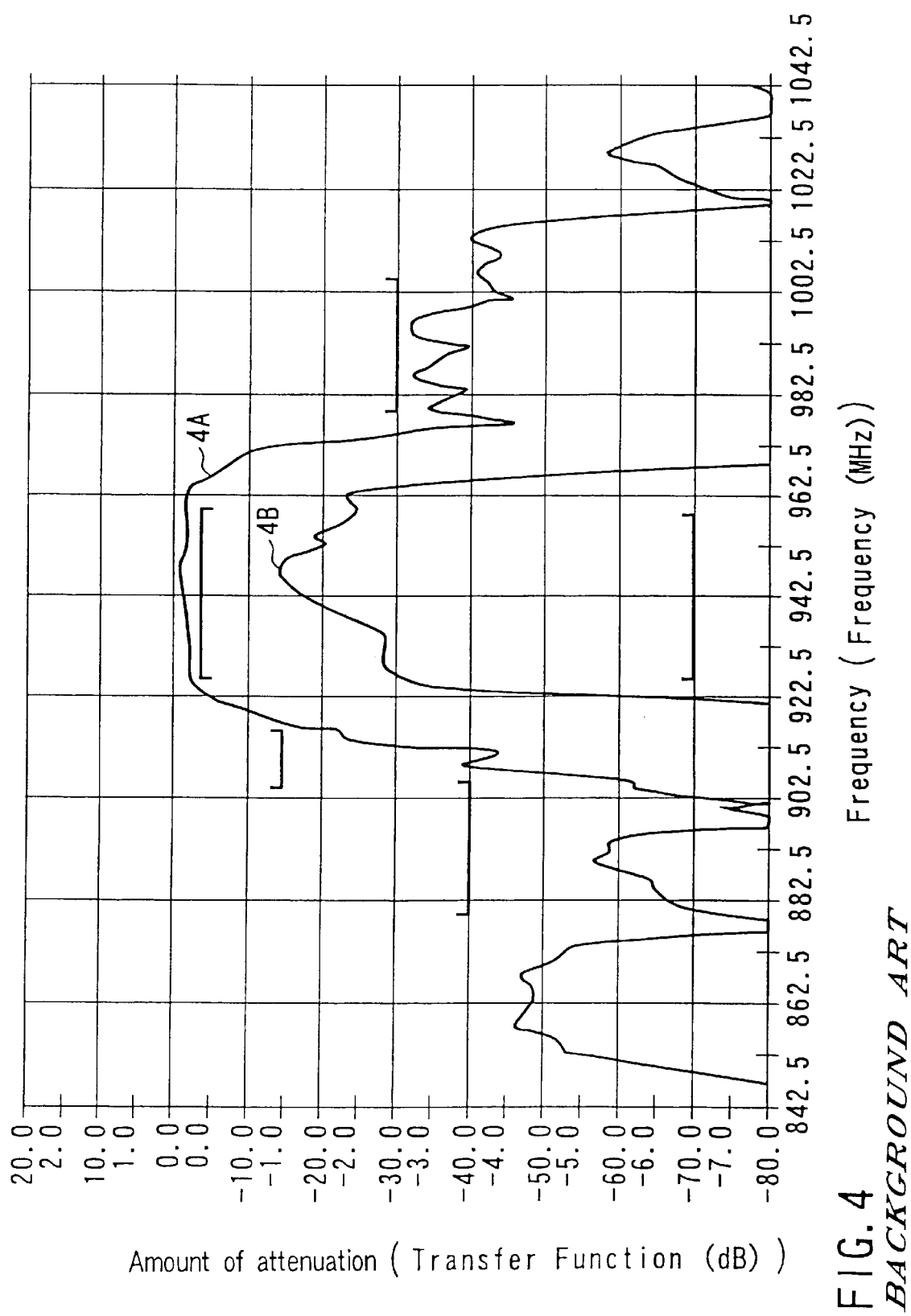
FIG. 4 is a diagram to help explain the frequency characteristic of the surface acoustic wave filter device when a stray capacitance has a great effect on the one-port elastic surface wave resonator filter.

FIG. 4 shows a frequency characteristic of the entire surface acoustic wave filter device. This is the frequency characteristic of the resonator filter (or notch filter) 300, with no opening section in the ground electrode.

The ordinate at left indicates the amount of attenuation, being graduated in units of 10 dB and in units of 1 dB. The abscissa indicates the frequency. In FIG. 4, the characteristic curve 4A represents the frequency characteristic of the entire device on a scale in units of 10 dB. The characteristic curve 4B represents the frequency characteristic of the entire device on a scale in units of 1 dB.

Figure 5:
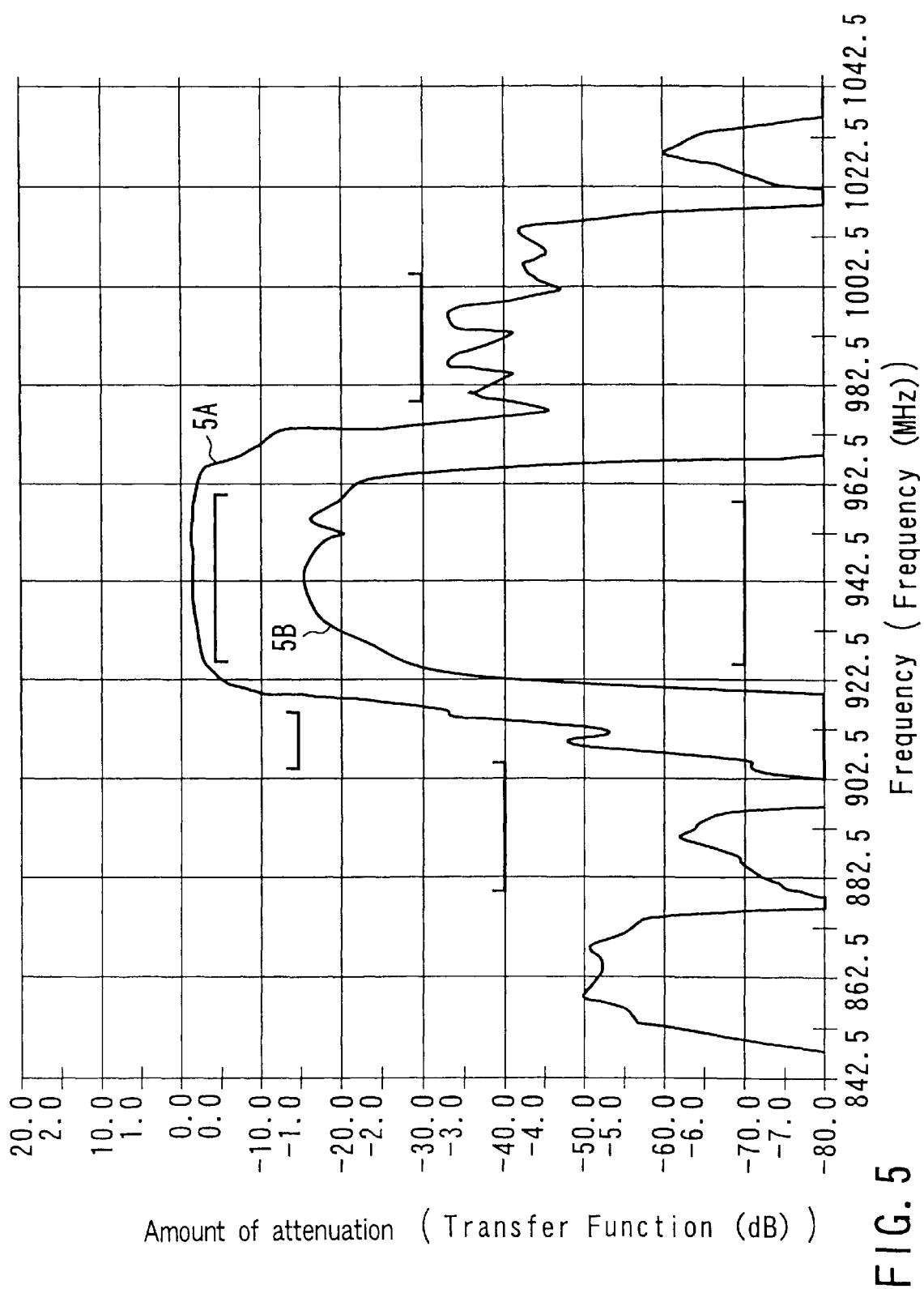
FIG. 5 is a diagram to help explain the frequency characteristic of the surface acoustic wave filter device when the stray capacitance in the one-port elastic surface wave resonator filter is reduced.

FIG. 5 shows a frequency characteristic of the entire surface acoustic wave filter device. This frequency characteristic is the characteristic (or the characteristic of the device related to the invention) when an opening section is made in the ground electrode.

The ordinate at left indicates the amount of attenuation, being graduated in units of 10 dB and in units of 1 dB. The abscissa indicates the frequency. In FIG. 5, the characteristic curve 5A represents the frequency characteristic of the entire device on a scale in units of 10 dB. The characteristic curve 5B represents the frequency characteristic of the entire device on a scale in units of 1 dB.

As seen from the comparison of the frequency characteristic with that of FIG. 4, the pass band shows a flat characteristic.

This invention is not limited to the above embodiment.

Figure 6A:
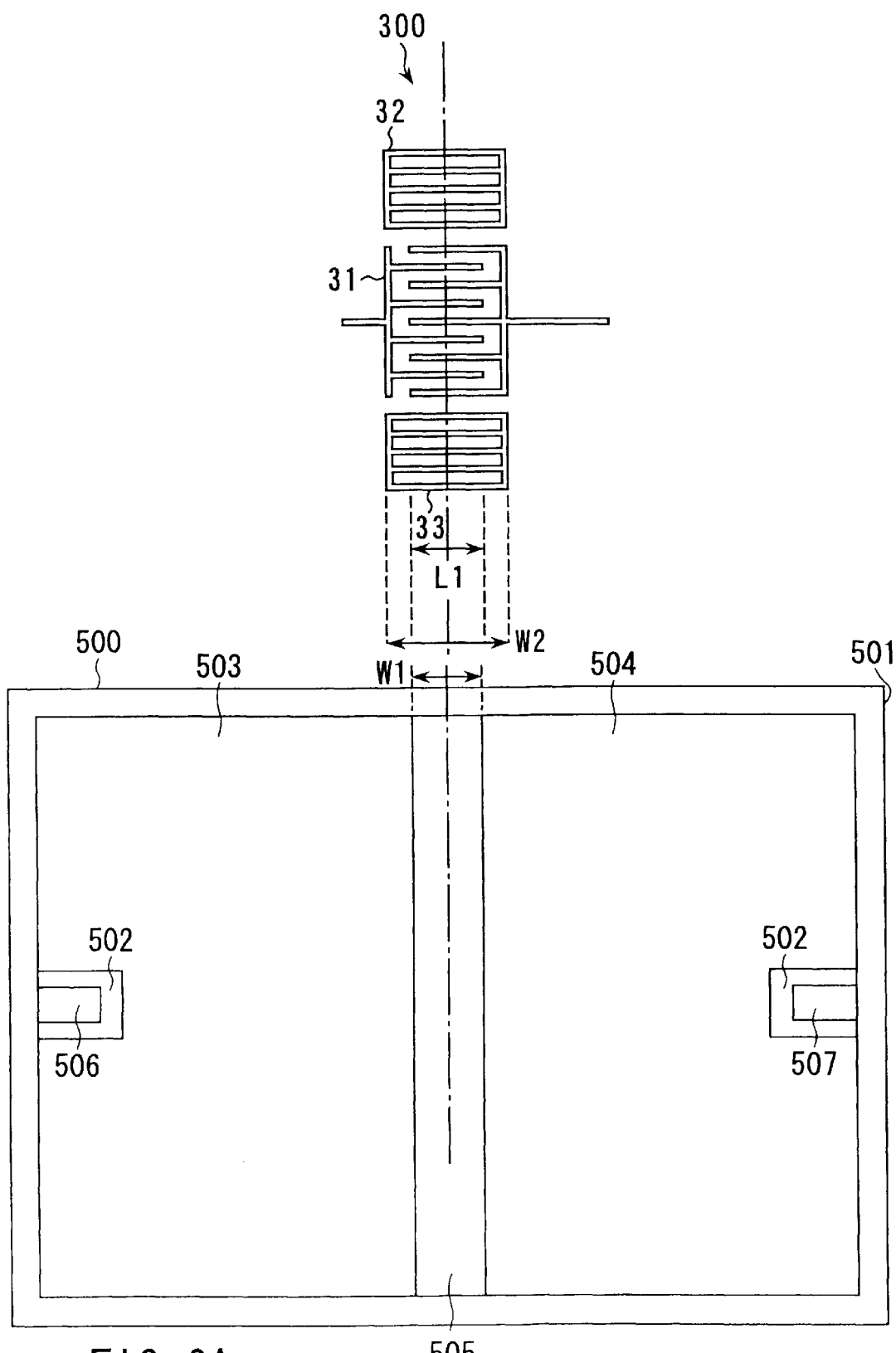
FIG. 6A shows another embodiment of the housing for the surface acoustic wave filter device according to the present invention.

FIG. 6A shows another example of the housing 500 used in an surface acoustic wave filter device according to the present invention. In the above embodiment, the width W1 of the gap 505 is set greater than the width W2 of the elastic surface wave resonator filter 300 (or the opening L1 of IDT) (W1<W2). In the embodiment of FIG. 6A, however, the width W1 of the gap 505 is designed to be smaller than the width W2 of the elastic surface wave resonator filter 300 (or the opening L1 of IDT). This configuration also produces the effect aimed at in this invention.

Figure 6B:
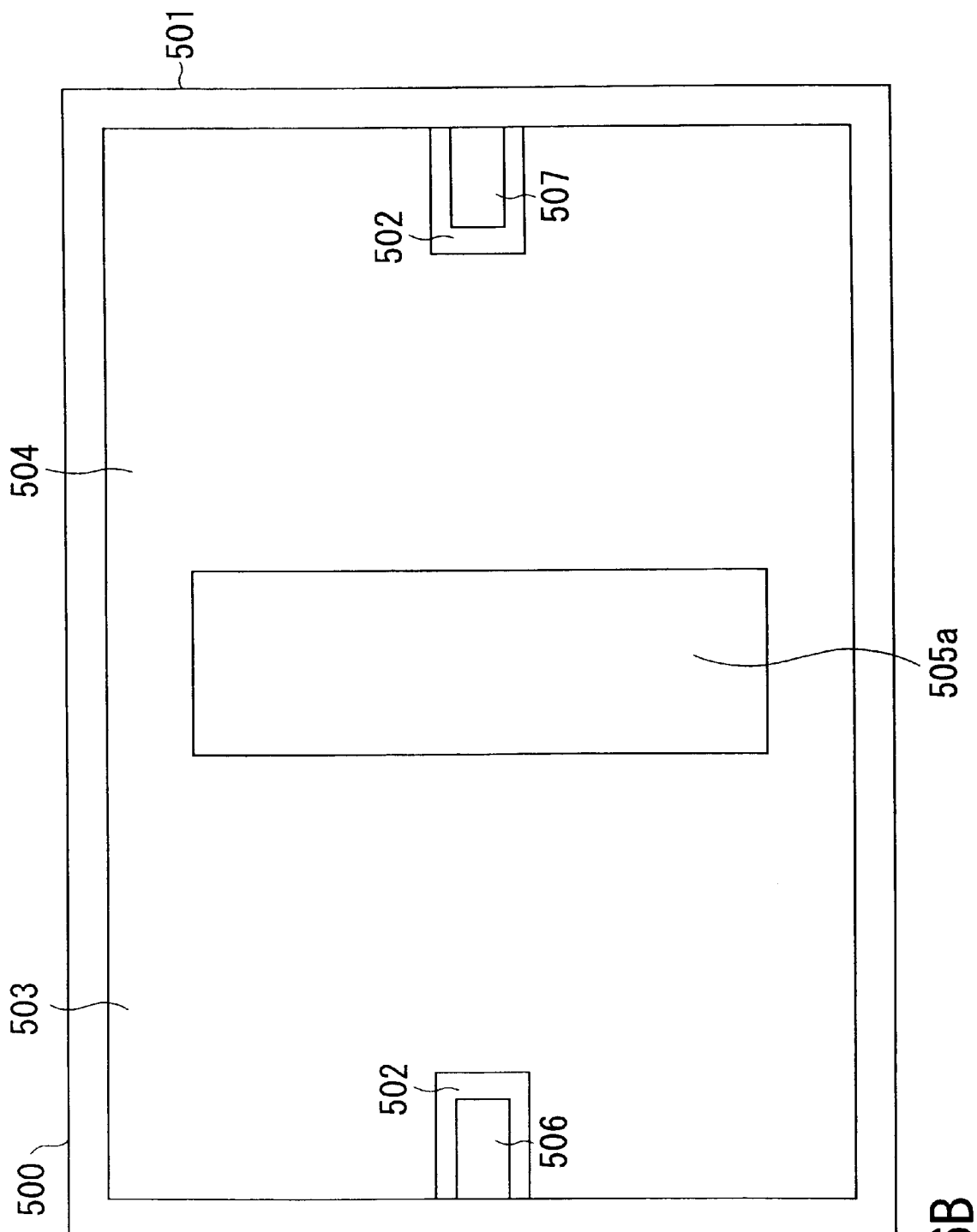
FIG. 6B shows still another embodiment of the housing for the surface acoustic wave filter device according to the present invention.

FIG. 6B shows still another example of the housing 500 used in an surface acoustic wave filter device according to the present invention. In the above embodiments, the gap (or opening section) 505 is formed from the top end to the bottom end. In the embodiment of FIG. 6B, an opening section 505a is formed by making a rectangular opening in part of the base 502. Forming such an opening section 505a so as to face the area of the elastic surface wave resonator filter 300 enables the stray capacitance in the filter 300 to be reduced. The relationship between the width of the opening section 505a and the width of the filter 300 may be as shown in FIG. 1B or as shown in FIG. 6A. That is, the width W1 may be smaller than (<W2) or larger than (>W2) the filter width W2 in the direction perpendicular to the direction in which the elastic surface wave from the elastic surface wave resonator filter 300 propagates.

Figure 7:
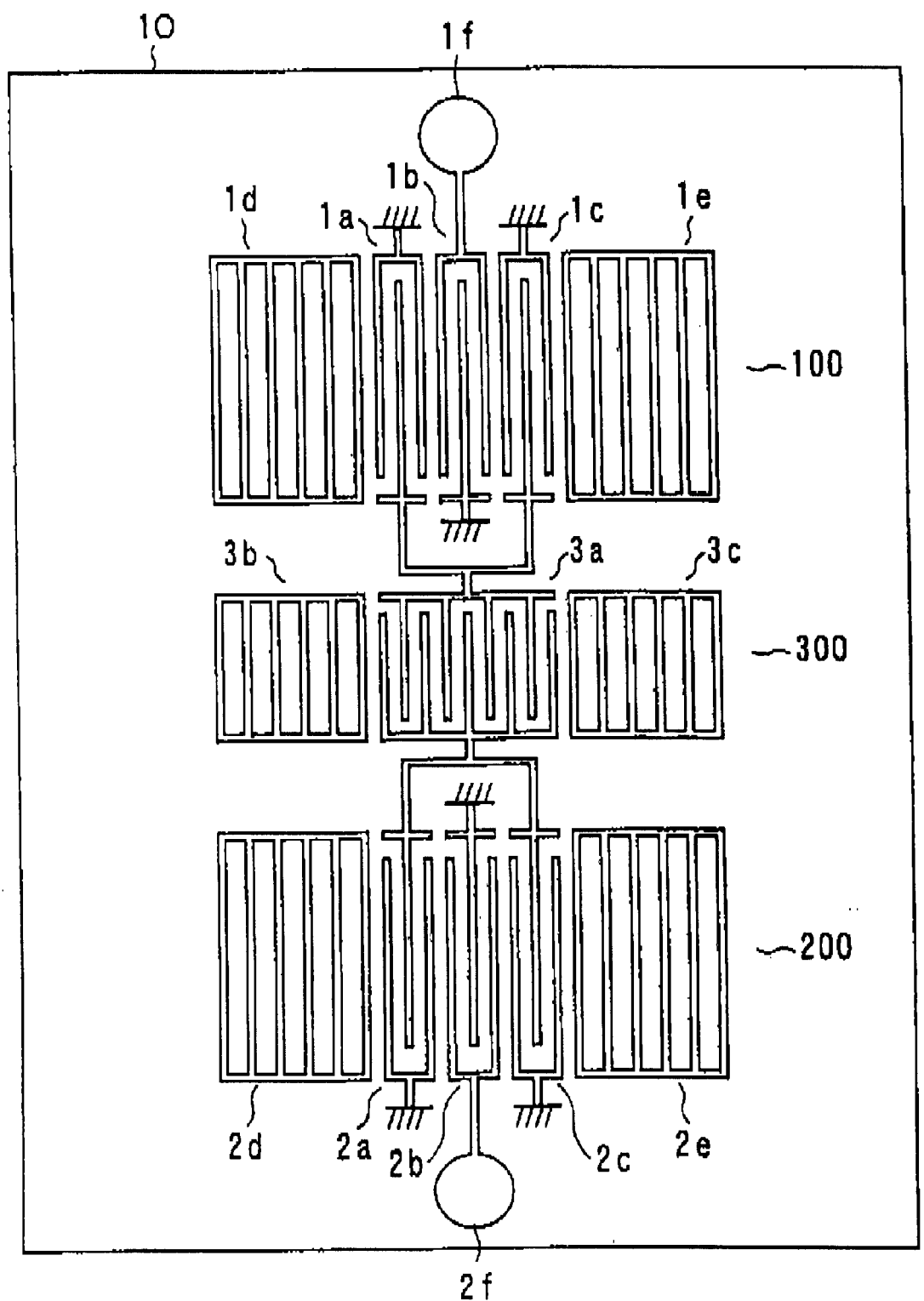
FIG. 7 shows an example of the elastic surface wave element of the surface acoustic wave filter device according to the present invention.
Figure 8:
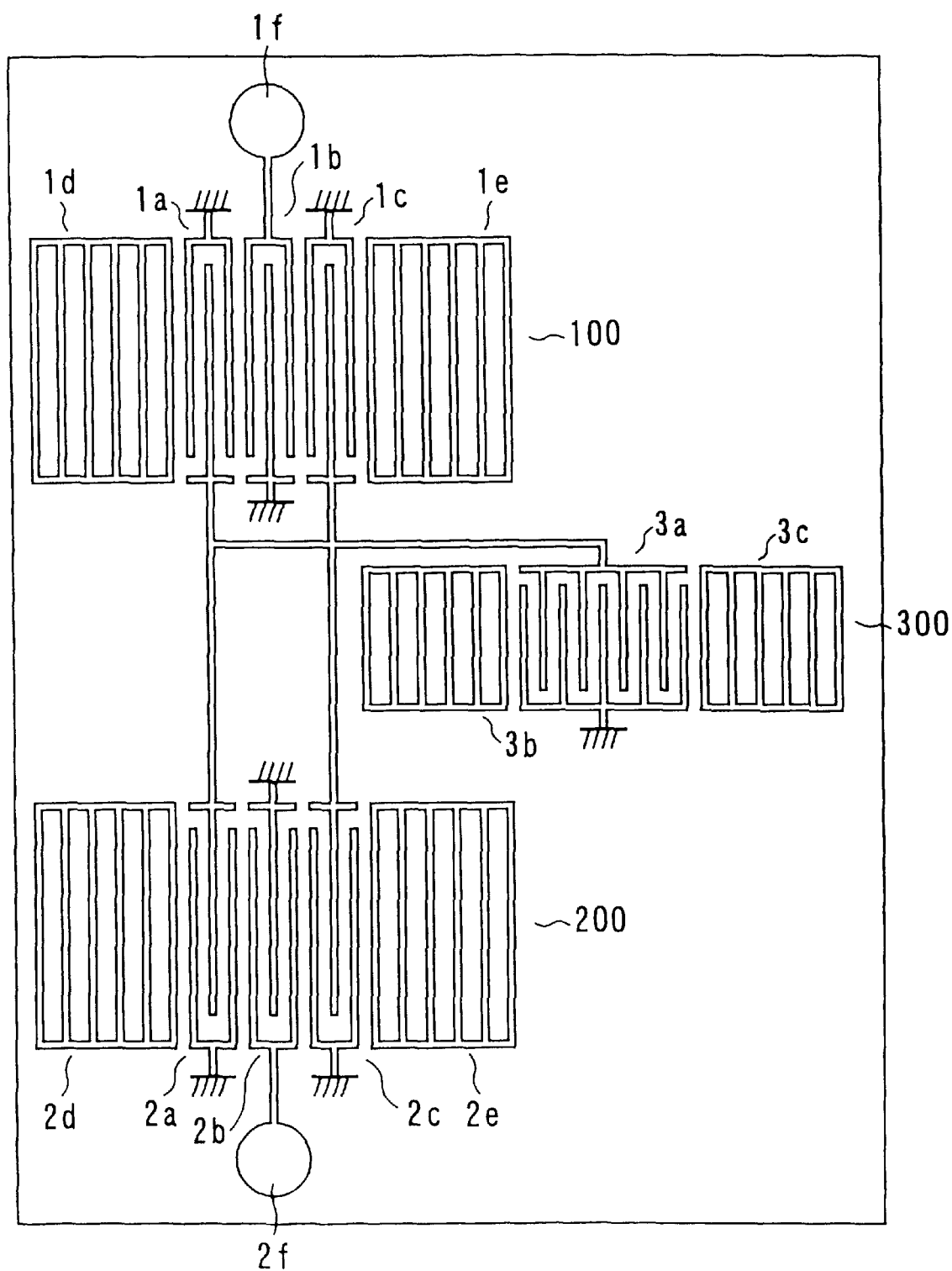
FIG. 8 shows another example of the elastic surface wave element of the surface acoustic wave filter device according to the present invention.

In this invention, the mode-coupling two-port surface acoustic wave filters are not necessarily of the type explained in the above embodiments. In the embodiments, the elastic surface wave resonator filter 300 has been connected in series with the mode-coupling two-port surface acoustic wave filters 100, 200. In contrast, as shown in FIGS. 7 and 8, the elastic surface wave resonator filter 300 may be connected in parallel with the mode-coupling two-port surface acoustic wave filters 100, 200. The mode-coupling two-port surface acoustic wave filters 100, 200 may have the same frequency characteristic or differ from each other in frequency characteristic.

First, in FIG. 7, on a piezoelectric substrate 10, two mode-coupling two-port surface acoustic wave filters 100, 200 and an elastic surface wave resonator filter 300 connected in series with the mode-coupling two-port surface acoustic wave filters 100, 200 are formed from a metal thin film, such as aluminium (Al).

The mode-coupling two-port surface acoustic wave filter 100 is composed of three IDTs 1a, 1b, 1c provided side by side, reflectors 1d, 1e provided on both sides of the IDTs 1a, 1b, 1c, and a terminal electrode 1f connected to a comb-tooth-like electrode constituting the IDT 1b. The mode-coupling two-port surface acoustic wave filter 200 is composed of three IDTs 2a, 2b, 2c provided side by side, reflectors 2d, 2e provided on both sides of the IDTs 2a, 2b, 2c, and a terminal electrode 2f connected to a comb-tooth-like electrode constituting the IDT 2b.

The elastic surface wave resonator filter 300 is composed of an IDT 3a and reflectors 3b, 3c provided on both sides of the IDT 3a.

In FIG. 8, on a piezoelectric substrate 10, two mode-coupling two-port surface acoustic wave filters 100, 200 and an elastic surface wave resonator filter 300 connected in parallel with the mode-coupling two-port surface acoustic wave filters 100, 200 are formed from a metal thin film, such as aluminium (Al).

The mode-coupling two-port surface acoustic wave filters 100, 200 have the same configuration as shown in FIG. 7. The elastic surface wave resonator filter 300 has the same configuration as shown in FIG. 7. However, the example shown in FIG. 8 differs from that of FIG. 7 in the position where the elastic surface wave resonator filter 300 is provided.

Figure 9:
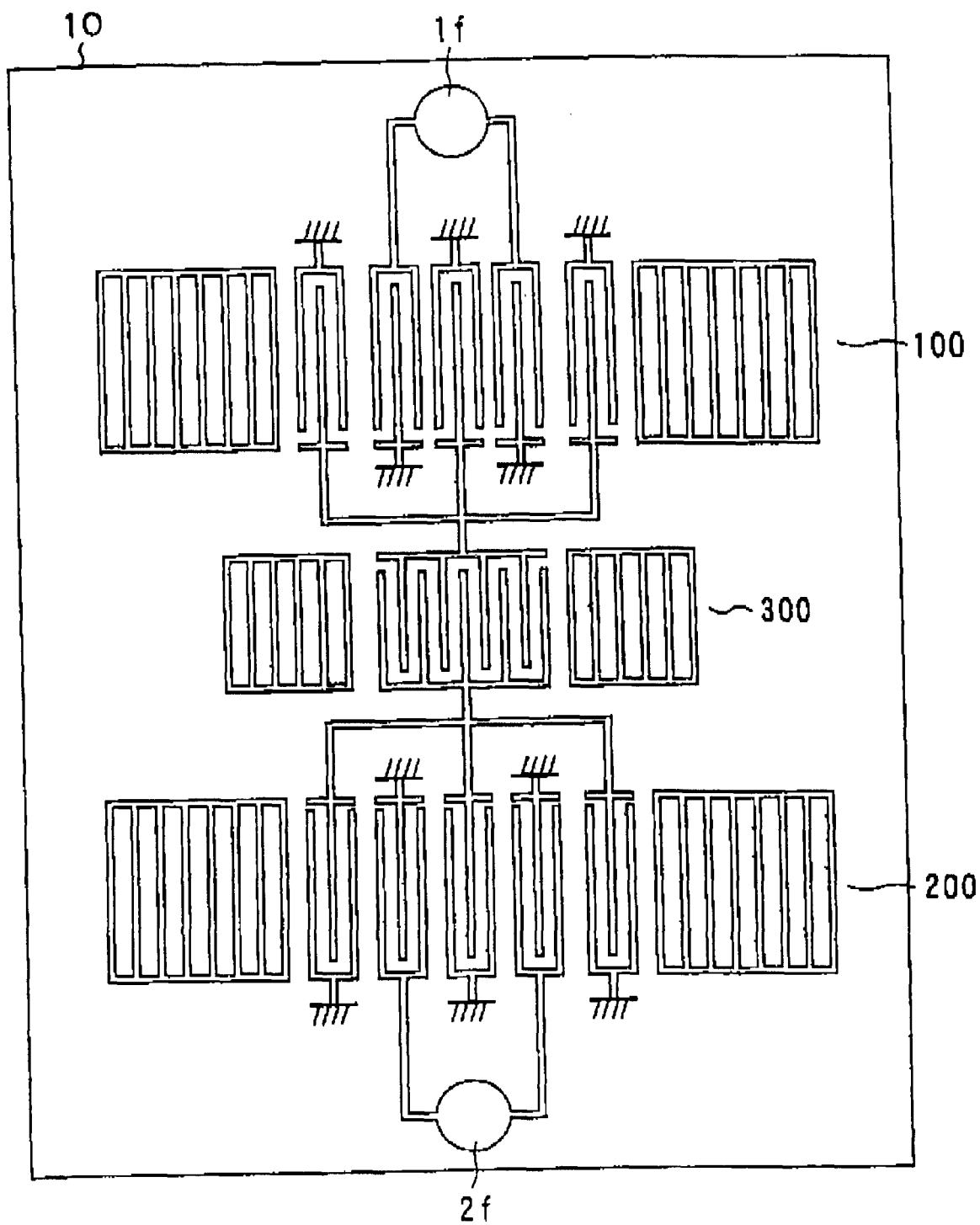
FIG. 9 shows still another example of the elastic surface wave element of the surface acoustic wave filter device according to the present invention.
Figure 10:
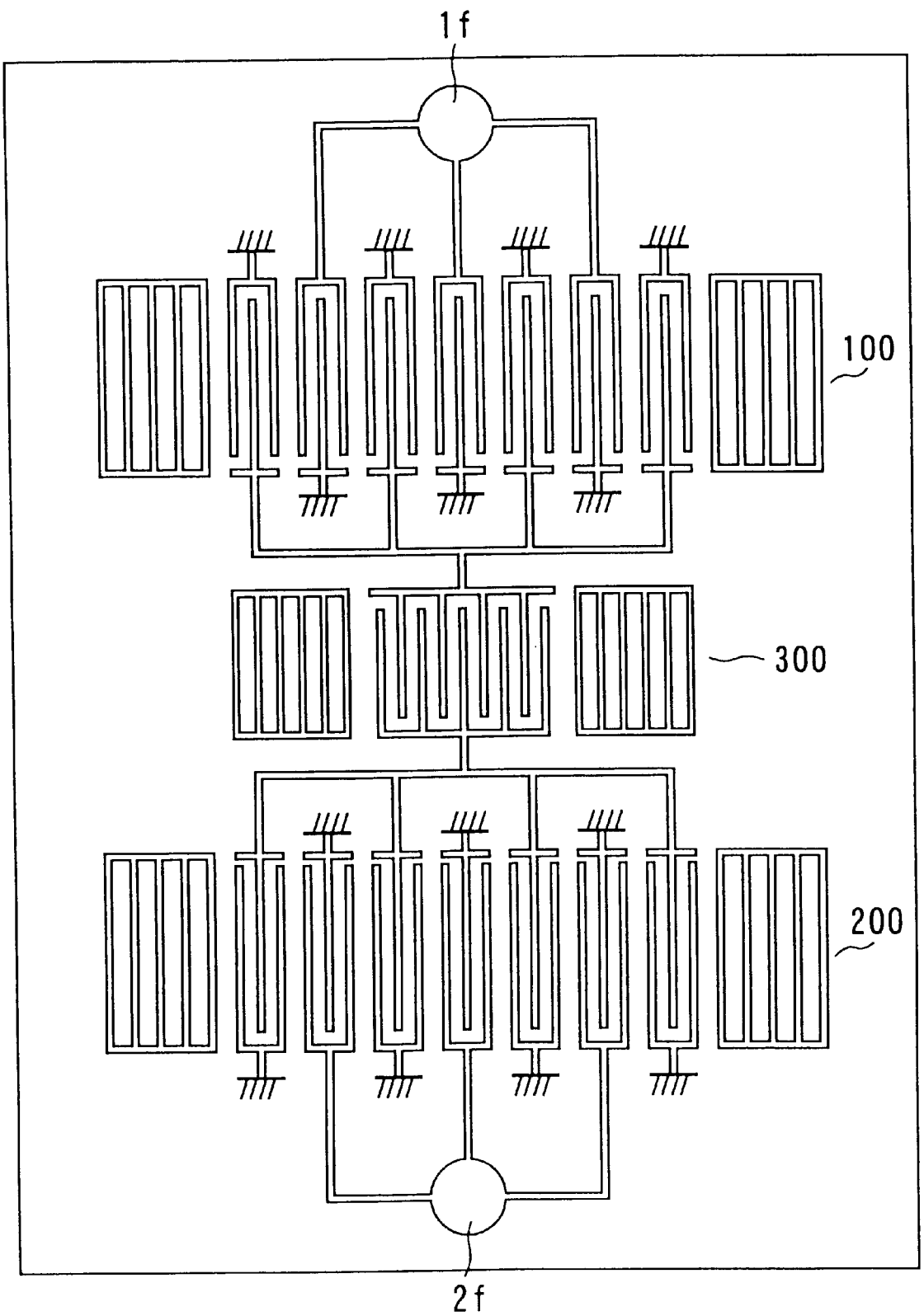
FIG. 10 shows still another example of the elastic surface wave element of the surface acoustic wave filter device according to the present invention.
Figure 11:
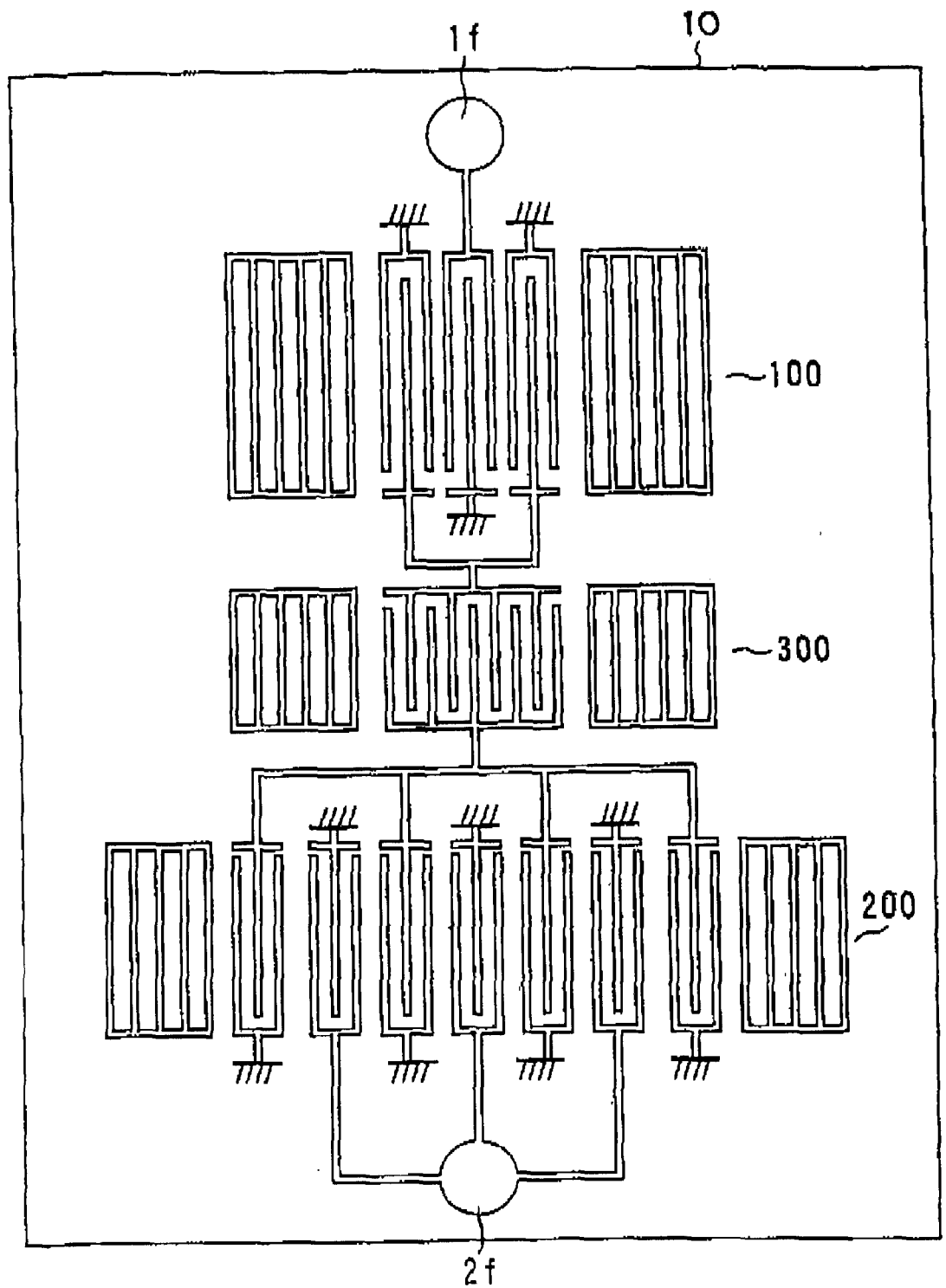
FIG. 11 shows still another example of the elastic surface wave element of the surface acoustic wave filter device according to the present invention.

FIGS. 9, 10, and 11 show still other embodiments of a surface acoustic wave filter element.

In FIG. 9, on a piezoelectric substrate 10, two mode-coupling two-port surface acoustic wave filters 100, 200 and an elastic surface wave resonator filter 300 connected in series with the mode-coupling two-port surface acoustic wave filters 100, 200 are formed from a metal thin film, such as aluminium (Al).

The mode-coupling two-port surface acoustic wave filter 100 is composed of five IDTs provided side by side, reflectors provided on both sides of the IDTs, and a terminal electrode 1f serving as a signal input section. The mode-coupling two-port surface acoustic wave filter 200 is composed of five IDTs provided side by side, reflectors provided on both sides of the IDTs, and a terminal electrode. The elastic surface wave resonator filter 300 is composed of an IDT, reflectors provided on both sides of the IDT, and a terminal electrode 2f serving as a signal output section.

In FIG. 10, on a piezoelectric substrate 10, two mode-coupling two-port surface acoustic wave filter 100, 200 and an elastic surface wave resonator filter 300 connected in series with the mode-coupling two-port surface acoustic wave filters 100, 200 are formed from a metal thin film, such as aluminum (Al).

The mode-coupling two-port surface acoustic wave filter 100 is composed of seven IDTs provided side by side, reflectors provided on both sides of the IDTs, and a terminal electrode 1f serving as a signal input section. The mode-coupling two-port surface acoustic wave filter 200 is composed of seven IDTs provided side by side, reflectors provided on both sides of the IDTs, and a terminal electrode 2f serving as a signal output terminal. The elastic surface wave resonator filter 300 is composed of an IDT and reflectors provided on both sides of the IDT.

In FIG. 11, on a piezoelectric substrate 10, two mode-coupling two-port surface acoustic wave filters 100, 200 and an elastic surface wave resonator filter 300 connected in series with the mode-coupling two-port surface acoustic wave filters 100, 200 are formed from a metal thin film, such as aluminium (Al).

The mode-coupling two-port surface acoustic wave filter 100 is composed of three IDTs provided side by side, reflectors provided on both sides of the IDTs, and a terminal electrode 1f serving as a signal input section. The mode-coupling two-port surface acoustic wave filter 200 is composed of seven IDTs provided side by side, reflectors provided on both sides of the IDTs, and a terminal electrode 2f serving as a signal output terminal. The elastic surface wave resonator filter 300 is composed of an IDT and reflectors provided on both sides of the IDT.

To incorporate an elastic surface wave element as shown in FIGS. 7 to 11 into the aforementioned housing 500, the ground terminal electrode corresponding to the elastic surface wave resonator filter has only to be removed.

This invention is not limited to the above-described embodiments and may be practiced or embodied in still other ways without departing from the sprit of essential character thereof.

As has been explained in detail, with the present invention, it is possible to provide a very good surface acoustic wave filter device which is capable of reducing the unnecessary stray capacitance component sufficiently even with a configuration formed by face down bonding techniques and which is also capable of realizing a practical pass band characteristic excellent in flatness.

A surface acoustic wave filter device according to this invention can be used in the field of electronic apparatuses, including mobile communications equipment and television sets.

What is claimed is:

1. A surface acoustic wave filter device where the electrodes of an elastic surface wave element are connected via bumps to the electrodes of a housing by face down bonding techniques, comprising:

an elastic surface wave element Including a first two-port surface acoustic wave filter, a one-port elastic surface wave resonator filter to which an output of the first surface acoustic wave filter is supplied, a second two-port surface acoustic wave filter to which an output of the one-port elastic surface wave resonator filter is supplied, elastic-surface-wave-element side signal input and output electrodes, and an elastic-surface-wave-element side ground electrode each formed on one face of a piezoelectric substrate; and a housing including signal input and output electrodes and a ground terminal electrode corresponding to the elastic-surface-wave-element side signal input and output electrodes and the elastic surface-wave-element side ground electrode, respectively, the ground terminal electrode having an opening section facing the one-port elastic surface wave resonator filter.

2. The surface acoustic wave filter device according to claim 1, wherein the opening section is so configured that a part of the ground terminal electrode facing the first two-port surface acoustic wave filter and a part of the ground terminal electrode facing the second two-port surface acoustic wave filter are separated electrically from each other.

3. The surface acoustic wave filter device according to claim 1, wherein the opening section comprises a rectangular shape.

4. The surface acoustic wave filter device according to claim 1, wherein the one-port elastic surface acoustic wave resonator filter is connected in series with the first and second two-port surface acoustic wave filters.

5. The surface acoustic wave filter device according to claim 1, wherein the one-port elastic surface acoustic wave resonator filter is connected in parallel with the first and second two-port surface acoustic wave filters.

6. The surface acoustic wave filter device according to claim 1, wherein the first and second two-port surface acoustic wave filters have the same frequency characteristic.

7. The surface acoustic wave filter device according to claim 1, wherein the first and second two-port surface acoustic wave filters differ from each other in frequency characteristic.

8. The surface acoustic wave filter device according to claim 1, wherein the first and second two-port surface acoustic wave filters have the same number of inter-digital transducers.

9. The surface acoustic wave filter device according to claim 1, wherein the first and second two-port surface acoustic wave filter; differ from each other in the number of inter-digital transducers.

* * * * *